United States Patent [19]
Hirzel

[11] Patent Number: 5,381,096
[45] Date of Patent: Jan. 10, 1995

[54] METHOD AND APPARATUS FOR MEASURING THE STATE-OF-CHARGE OF A BATTERY SYSTEM

[76] Inventor: Edgar A. Hirzel, 17447 Lahey St., Granada Hills, Calif. 91344

[21] Appl. No.: 132,160

[22] Filed: Oct. 5, 1993

Related U.S. Application Data

[63] Continuation of Ser. No. 866,333, Apr. 9, 1992, abandoned.

[51] Int. Cl.$^6$ ............................................. G01N 27/416
[52] U.S. Cl. ......................................... 324/427; 320/48; 340/636
[58] Field of Search .............. 324/426, 427, 430, 433; 364/481–483, 578, 150, 151; 320/48

[56] References Cited

U.S. PATENT DOCUMENTS

| | | | |
|---|---|---|---|
| 3,676,770 | 7/1972 | Sharaf et al. | 320/48 |
| 3,753,094 | 8/1973 | Furuishi et al. | |
| 4,678,998 | 7/1987 | Muramatsu | 324/427 |
| 4,697,134 | 9/1987 | Burkum et al. | 320/48 |
| 4,719,427 | 1/1988 | Morishita et al. | 324/427 |
| 4,743,855 | 5/1988 | Randin et al. | 324/430 |
| 4,849,700 | 7/1989 | Morioka et al. | 324/427 |
| 4,876,513 | 10/1989 | Brilmyer et al. | 324/427 |
| 4,888,716 | 12/1989 | Ueno | 364/550 |
| 4,902,956 | 2/1990 | Sloan | 324/4 |
| 4,916,438 | 4/1990 | Collins et al. | 346/636 |
| 4,968,942 | 11/1990 | Palanisamy | 324/427 |
| 5,130,659 | 7/1992 | Sloan | 320/13 |

OTHER PUBLICATIONS

Exhibit A is a copy of the *Storage Battery Technical Service Manual* published by the Battery Council International—Nov.—1987.
Exhibit B is an article by A. F. Burke, entitled *Evaluation of State-Of-Charge Indicator Approaches for EVs*—Feb. 1989.
Exhibit C is an article by Ronald G. Anderson, entitled *Requirements for Improved Battery Design and Performance*—Feb. 1990.
Exhibit D is a brochure for the Battery Watch II software program offered by AST Research, Inc.—Apr. 1991.

*Primary Examiner*—Maura K. Regan

[57] ABSTRACT

A method and apparatus for measuring the state-of-charge of a battery is provided, which includes a metering system to communicate the state-of-charge to an operator of a device powered by the battery. A digital electronic model is provided to compute the instantaneous charge in a storage battery that tracks the actual terminal voltage of the battery. In the digital model, the battery model is expressed as a computer program. The electronic model derives from the measurement of the actual terminal voltage of an operating battery an internal voltage corresponding to the open circuit voltage of the battery. This internal voltage, representative of the state-of-charge of the battery, is communicated to an operator through a display.

11 Claims, 6 Drawing Sheets

FIG. 4

```
10  'PROGRAM IS BATDIS. BAS CALCULATES DISCHARGE CURVES
11  '(C) 1992 EDGAR A. HIRZEL, ALL RIGHTS RESERVED
20  CLS
30  SCREEN 2
40  FOR  J=0 TO 30 STEP 1: PSET(0,199-10*J): PSET(24*J,199):-
PSET(24*J,120): NEXT
50  LOCATE 1,15: PRINT"TIME MIN","AMPS"
52  LOCATE 16,3: PRINT "8 VOLTS" :LOCATE 16,50: PRINT " TIME >"
60  G=3
70  R=.00798              'INIT. RESISTANCE
80  EC=12.68               'VOLTS @ 100% SOC
90  EBI=EC                 'INIT. VOLTAGES
100 E=EC                   '    "        "
110 EI=EC                  '    "        "
120 READ I                 'READ BAT. VOLTS
130 DT=2                   'DELTA T
160 EC=EC-(I*DT/400000!)            'INTEGRATE
170 R=( I*(ABS(12.68-EC) 4))+.0078      'VARIABLE RESISTANCE
180 DE=I*                                      'IR DROP
200 E=EC-DE                 'BAT. TERMINAL VOLTAGE
210 SOC=(INT((EC-11.68)*1000))/10           'CALCULATE SOC
220 LOCATE G ,15: PRINT INT(T/60),I
260 PSET(.2  *T, 199-10*(E))
262 GOTO 300
270 PSET(.2  *T, 199-SOC)
300 IF E>8! THEN T=T+DT:TI=TI+DT:GOTO 130
320 ON ERROR GOTO 360
330 T=0 : G=G+1: GOTO 70
340 ON ERROR GOTO 360
350 DATA 91.5,127,208,327,410,528
360 GOTO 360
```

| TIME HR. | AMPS |
|---|---|
| 28.84 | 5.88 |
| 9.88 | 8.95 |
| 4.92 | 15.68 |
| 2.98 | 23.38 |
| 1.84 | 53.88 |

| TIME MIN | AMPS |
|---|---|
| 32 | 91.5 |
| 21 | 127 |
| 18 | 288 |
| 5 | 327 |
| 4 | 418 |
| 2 | 528 |

FIG. 8

```
10 'CLOSE 1:CLOSE 2
20 'OPEN"O",#2 "A:BATDATA.ASC"
30 OPEN"COM1:9600,N,8,2,CS,DS" FOR RANDOM AS 1   'OPEN SERIAL PORT RS232
40 WHILE LOC(1)>0:S$=INPUT$(LOC(1),1):WEND       'CLEAR PORT OF OLD CHARS
50 M=1
60 J1=100:K1=50
70 KEY OFF
80 CLS:TIMER OFF
90 C1=300
100 C=37258
110 R1=.05
120 EC=13.2
130 TZI=TIMER
140 RP=1
150 TIM=TIMER:
160 START:
170 FOR CN=1 TO 2              'A/D CHANNEL SELECT
180 IF CN=2 THEN CN=25         'CHANNEL 25 IS TEMP, 1 IS TERMINAL VOLTS
190 GOSUB SELCHANNEL
200 TIMER ON
210 OFFSET=0                   'PROVIDE FOR TEMP CALIBRATION OFFSET
220 IF CN=25 THEN ZD=10*((1.8*((Z/10)-273))+32+OFFSET)
230 IF TIMER-TIM>=19200 THEN TIM=TIMER
240 IF CN=1 THEN E1 = ZD/10
250 ET=(E1+(5*E2)+(7*E3)+(5*E4)+E5)/19
260 IX=(ET-E)*KF
270 E5=E4:E4=E3:E3=E2:E2=E1
280 NEXT CN
290 GOSUB BEGIN
300 IF CN>2 THEN GOTO START
310 SELCHANNEL:                'SELECT A/D CHANNEL
320 PRINT#1,CHR$(CN-1);
330 GOSUB READY
340 REQHYBYTE:
350 PRINT#1,CHR$(161);         'REQUEST HIGH BYTE
360 GOSUB READY
370 HB=CH
380 IF(HB AND 128)<>0 THEN GOTO REQHYBYTE 'CHECK FOR BUSY FLAG
390 PRINT#1,CHR$(145);         'REQUEST LOW BYTE
400 GOSUB READY
410 LB=CH
420 HM=HB AND 15               'SELECT 1ST 4 BITS OF HIGH BYTE
430 Z=LB+256*HM                'ANALOG READING
440 RETURN

450 READY:                     'IS A/D READY
460 IF LOC(1)=0 THEN GOTO READY 'CHECK INPUT BUFFER FOR DATA
470 X$=INPUT$(LOC(1),1)        'GET DATA FROM PORT 1
480 CH=ASC(X$)                 'CONVERT TO DECIMAL
490 RETURN

500 BEGIN:
510 TZ=TIMER                   'START DELTA TIME
520 IF(TIMER-TIM)<150 THEN C=200 ELSE C=37258  'SET INITIAL CONDITIONS
530 IF(TIMER-TIM)<150 THEN KF=10 ELSE KF=50
540 I=(IX+(5*I2)+(7*I3)+(5*I4)+I5)/19    'FILTER
550 A$=INKEY$                  'CHANGE RESISTANCE
560 IF A$="R" THEN R1=R1+.001       '    "        "
570 DT=(TZ-TZI)
580 TZI=TZ                     'CALCULATE DT
590 EC=EC+(I*DT/C)             'INTEGRATE CHARGE
600 R=(4*(I3:-EC)*4)+R1        'CALCULATE BATTERY RESISTANCE
610 E=EC+(I*R)                 'CALCULATE TERMINAL VOLTAGE
620 SOC=(INT((EC-11.89)*1266))/10  'CALCULATE SOC
630 I5=I4:I4=I3:I3=I2:I2=I
640 RETURN
```

METHOD AND APPARATUS FOR MEASURING THE STATE-OF-CHARGE OF A BATTERY SYSTEM

This application is a continuation of application Ser. No. 07/866,333, filed Apr. 9, 1992, now abandoned.

A portion of the disclosure of this patent document contains material which is subject to copyright protection. The copyright owner has no objection to the facsimile reproduction by any one of the patent disclosure, as it appears in the Patent and Trademark Office patent files and records, but otherwise reserves all copyright rights whatsoever.

FIELD OF THE INVENTION

The present invention relates generally to a method and apparatus for measuring the state-of-charge of a battery storage system, and more specifically, to a digital system for modeling the actual terminal voltage of a battery while the battery is connected to a load and the load is operating.

BACKGROUND OF THE INVENTION

According to the Battery Council International (BCI), the state-of-charge of a battery is defined as the amount of electrical energy stored in a battery at a given time expressed as a percentage of the energy when the battery is fully charged. The need for measuring the state-of-charge of a storage battery has recently come to the fore as a result of the increased popularity of electric vehicles (EV's). The problem of measuring the state-of-charge of a storage battery, however, is not new.

What is needed is a metering system analogous to the current fuel gauge systems employed in internal combustion powered vehicles to measure the state-of-charge of the battery storage systems employed with EV's. Such a metering system would provide the operator of an EV with an indication of the amount of charge remaining in the battery and, consequently, an indication of the time remaining before recharging of the battery is necessary.

Conventional internal combustion fuel storage systems are typically monitored by a relatively simple fuel float system. The determination of the amount of fuel remaining in the fuel storage system is easily calculated using simple mechanical and electrical devices. Fuel monitoring systems for internal combustion engines have even advanced to the point that many automobiles now include computers that calculate not only the amount of fuel remaining in the fuel tank, but the miles remaining before refueling is needed.

A simple "Full/Empty" device similar to the fuel monitoring systems employed with internal combustion vehicles, however, is not currently available for battery storage systems, yet such a device will, in the future of the EV, become very necessary. The need for such a device will become particularly pronounced for early model EV's since the availability and location of battery charging facilities will be limited. Without an accurate measure of the remaining charge in a battery storage system, and the time and/or operating miles remaining in the vehicle's storage battery, the operator of an EV could easily become stranded miles from home or available recharging facilities.

For battery storage systems employed in EV's, the operable range of charge required to power such vehicles exists in a narrow range below the fully charged capacity of the battery. According to the BCI, the difference between a fully charged battery and an empty battery can be expressed either in terms of the battery's chemical or electrical characteristics. The data shown in Table 1 is published in the BCI Storage Battery Technical Service Manual and indicates the charge level of a battery in terms of the specific gravity and the open circuit voltage of the battery.

TABLE 1

| Charge Level | Specific Gravity | Voltage (open circuit) |
|---|---|---|
| 100% (full) | 1.265 | 12.68 |
| 75% | 1.225 | 12.45 |
| 50% (half) | 1.190 | 12.24 |
| 25% | 1.155 | 12.06 |
| 0% (empty) | 1.120 | 11.89 |

Although it is possible to measure the specific gravity of a storage battery using an hydrometer, this is not a practical method for continuously monitoring the state-of-charge for the EV. An alternative method would be to measure the open circuit voltage of the battery using a voltmeter. Unfortunately, a simple measurement of the terminal voltage of a battery that is operating (i.e., being charged or discharged) will not accurately reflect the state-of-charge of the battery. What is required is a metering system that can continuously measure the state-of-charge of the vehicle battery while the vehicle is operating and display the instantaneous state-of-charge to the vehicle operator.

SUMMARY OF THE INVENTION

A state-of-charge metering system according to the invention, therefore, computes the instantaneous charge of a storage battery by establishing a digital model of the battery that tracks the actual measured terminal voltage of the battery. The model derives from measurement of the actual terminal voltage of an operating vehicle, an internal voltage that corresponds to the open circuit voltage of the battery. From this information, the system continuously calculates, in real-time, the state-of-charge of the vehicle storage battery.

A metering system made according to the invention for determining the state-of-charge of a battery thus includes circuitry for measuring the actual terminal voltage of the battery during operation of the vehicle. An electronic circuit model is provided for simulating the internal impedance and capacitance of the battery with respect to time, and also for simulating the terminal voltage of the battery. The simulated terminal voltage of the battery is then forced or compelled to agree to the measured actual terminal voltage of the battery. As a result, a signal representing the state-of-charge of the battery is developed in response to the voltage across the simulated internal capacitance of the battery.

In one presently preferred embodiment of the invention, the electronic circuit model consists of a digital system. In such a digital system, the electronic circuit model is expressed in terms of a computer program stored in memory and capable of execution on a microprocessor or other CPU-based system.

In the preferred embodiment of the invention, a display is also provided to communicate the signal representing the state-of-charge of the battery to the vehicle operator. Specific embodiments of such a display include a dial gauge similar to a conventional fuel gauge, or a digital read-out. In the preferred embodiment, the state-of-charge metering system also computes the miles remaining at the current operating speed and state-of-charge of the battery, and displays this information to the vehicle operator.

A state-of-charge metering system made according to the invention thus provides a system for measuring and displaying the instantaneous charge remaining in a storage battery. Such a metering system presents unique advantages over prior methods for measuring the state-of-charge of the storage batteries employed in EV's. The state-of-charge metering system continuously provides to the operator of the EV an indication of the amount of charge remaining in the vehicle battery without the need for the operator to exit the vehicle and use complicated instrumentation such as hydrometers and voltmeters. An indication of the remaining charge allows the operator to determine when recharging of the vehicle battery is required, thus avoiding loss of operation of the EV at a distance from available recharging facilities.

BRIEF DESCRIPTION OF THE DRAWINGS

FIG. 4 is a computer program which simulates the actual performance of a real storage battery;

FIG. 5 includes two discharge voltage curves for a 12-volt, 100 Ah (20h), SLI battery at 25° C., where

FIG. 6 includes two computer-generated plots of the discharge voltage from the computer program shown in FIG. 4, where

FIG. 8 is a preferred computer program employing a finite difference routine for use with an actual battery and a battery metering system made according to the invention;

DETAILED DESCRIPTION OF THE PRESENTLY PREFERRED EMBODIMENTS

Theoretically, a storage battery may be modeled by a network of resistors and capacitors, which represent the electrical characteristics of the battery. Although the capacity of a storage battery needs to be expressed in terms of thousands of farads instead of the microfarads conventionally available in electronic circuits, the same relationships and mathematics can be used to examine the performance of such a circuit. Similarly, the resistances encountered in a storage battery circuit are usually very small and vary with the size of the battery, the temperature of the battery and the chemistry of the battery. These resistance values and variations can, however, be determined, and a battery equivalent circuit model can be developed. A detailed examination of the storage battery model demonstrates a rational physical model of the battery, as well as how this model can accurately reproduce actual battery performance data.

Storage Battery Model

Figure 1:
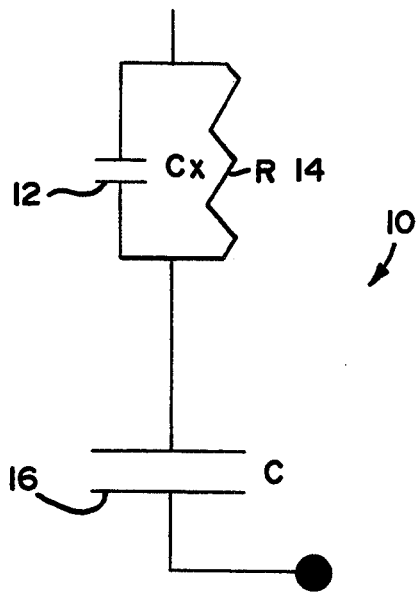
FIG. 1 is a circuit model equivalent of the electrical parameters of a storage battery.

A lead-acid storage battery stores electrical charge in an electrochemical state akin to an electrolytic capacitor. Although a storage battery is primarily an electrochemical system, a very useful and easily manipulated model can be expressed using only electronic components. Referring to FIG. 1, what is shown is a simplified circuit model equivalent of a storage battery, generally designated at 10. The circuit model 10 includes as components a parallel capacitor 12 and resistor 14, in series configuration with a second large capacitor 16.

It will be appreciated by those skilled in the art that the model depicted in FIG. 1 applies not only to lead-acid storage batteries, but in general to any storage battery such as those employed with heart pacemakers, portable computers and other consumer, medical or industrial devices. Consequently, the state-of-charge metering system of this invention can be employed to model any storage battery without departing from the spirit and scope of the invention.

The physical capacity necessary for the large capacitor 16 is extremely big in comparison to the values currently available from standard electronic components. In fact, for most of the battery applications mentioned above, the required value for the large capacitor 16 is on the order of thousands of farads. It must be of such high magnitude to be capable of delivering hundreds of amperes of current for sustained periods of time. For example, the typical current that a standard internal combustion vehicle battery delivers is 600 cold cranking amps (CCA).

Of course, the current that a battery can deliver is limited by the internal resistance of the battery. This resistance is represented by the resistor 14 depicted in the electrical model 10 of FIG. 1. Although as such in FIG. 1, the capacitance and resistance of an actual storage battery do not always operate in a linear manner. Thus, the resistor 14 must behave in a non-linear manner to accurately model the internal resistance of a storage battery.

The internal resistance of a storage battery has been found to vary with the state-of-charge of the battery. Battery tests indicate that this resistance is very small when the battery is charged, thus permitting large currents to be delivered to a load attached to the battery. However, as the state-of-charge, or more accurately the specific gravity of the electrolyte contained within the battery charges, the resistance value changes. This change in resistance translates to a limited useful operating range of the battery as shown in Table 2.

TABLE 2

| SOC | 40 A | 80 A | 120 A | 160 A | 200 A | 240 A | 280 A | 320 A | 360 A | 400 A | Volts | Res. |
|---|---|---|---|---|---|---|---|---|---|---|---|---|
| 0.9 | 123.2 | 121.0 | 118.8 | 116.3 | 113.6 | 111.2 | 108.6 | 105.7 | 104.0 | 101.2 | 125.9 | .0617 |
| 0.8 | 122.6 | 120.2 | 117.6 | 115.61 | 112.8 | 110.4 | 107.9 | 105.4 | 103.2 | 100.8 | 125.0 | .0609 |
| 0.7 | 121.9 | 119.6 | 116.6 | 114.6 | 112.0 | 109.6 | 107.2 | 105.0 | 102.4 | 100.0 | 124.2 | .0606 |

TABLE 2-continued

| SOC | 40 A | 80 A | 120 A | 160 A | 200 A | 240 A | 280 A | 320 A | 360 A | 400 A | Volts | Res. |
|-----|------|------|-------|-------|-------|-------|-------|-------|-------|-------|-------|------|
| 0.6 | 120.8 | 118.6 | 115.8 | 113.4 | 110.8 | 108.4 | 106.0 | 103.2 | 100.8 | 98.4 | 123.4 | .0627 |
| 0.5 | 120.0 | 117.6 | 114.8 | 112.4 | 110.0 | 107.2 | 104.6 | 102.2 | 99.6 | 97.1 | 122.6 | .0638 |
| 0.4 | 119.2 | 116.8 | 113.6 | 111.2 | 108.4 | 106.0 | 103.6 | 101.0 | 98.0 | 95.6 | 121.7 | .0655 |
| 0.3 | 118.4 | 115.8 | 113.0 | 110.2 | 107.2 | 104.4 | 101.6 | 99.0 | 96.0 | 93.6 | 121.3 | .0698 |
| 0.2 | 117.4 | 114.0 | 111.2 | 107.4 | 104.4 | 101.4 | 98.2 | 95.0 | 91.8 | 89.0 | 120.4 | .0792 |
| 0.1 | 115.9 | 112.4 | 108.8 | 104.5 | 101.2 | 97.6 | 94.0 | 90.4 | 87.0 | 83.6 | 119.4 | .0902 |
| 0.0 | 114.4 | 110.4 | 106.41 | 102.2 | 98.2 | 94.0 | 90.0 | 86.0 | 82.0 | 78.0 | 118.5 | .1014 |

Table 2 includes data reported in SAE Technical Paper 890816, "Evaluation of State-of-Charge Indicator Approaches for EVs", by A. F. Burke. The data listed in Table 2 were taken by making very short current-pulse measurements of a battery at the state-of-charge listed in the left column. The voltage and resistance values recorded in the rightmost columns of Table 2 are for an EV powered by ten 12-volt batteries connected in series.

Figure 2:
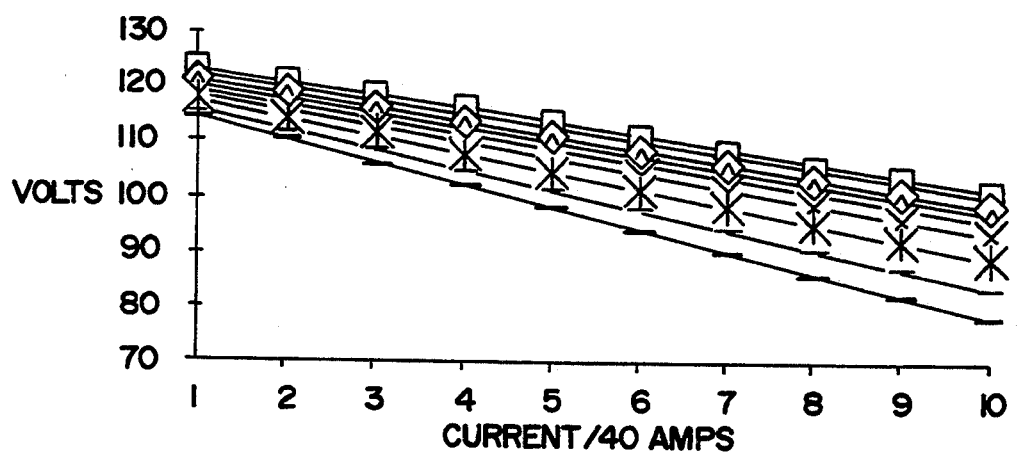
FIG. 2 is a graph of the voltage and resistance values of ten 12-volt batteries connected in series configuration.
Figure 3:
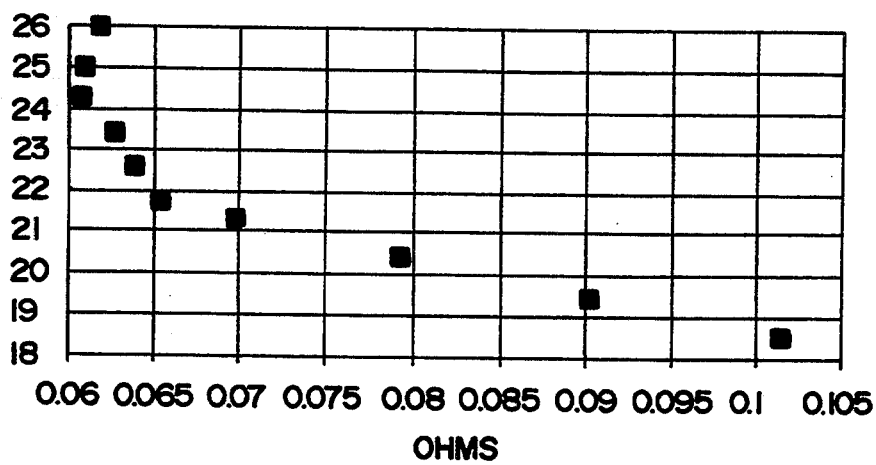
FIG. 3 is a graph of the internal resistance of a storage battery measured against the open circuit voltage of the battery.

The values for the electronic components in the storage battery model (FIG. 1) must therefore vary and track the values shown in Table 2 in order to accurately model an actual battery. By computing the slope and intercept of each row of data (FIG. 2), the open circuit voltage corresponding to a given state-of-charge of the battery is obtained. In addition, the value and variation of the battery internal resistance as a function of the state-of-charge is also obtained (FIG. 3).

From the data shown in Table 2, the normal internal resistance of a lead-acid storage battery is calculated to be about 0.0061 ohms. This value, however, increases very rapidly as the battery is discharged (see FIG. 3). Although the variation in internal resistance is due to chemical changes (i.e., changes in the specific gravity of the electrolyte), this variation can be expressed mathematically either as a function of the state-of-charge, or as the corresponding battery no-load voltage (the voltage across the large capacitor 16).

The following expression has been developed for describing the resistance (R) for a 100 Ah (5 Amps-20 hour), 12-volt battery:

$$R = Ro + 0.6(ABS(12.65 - Ec))^4$$

where:

$$Ro = 0.0069 \text{ ohms}$$

The capacitance of the battery can also be expressed as:

$$dE \cdot C = I \cdot dT$$

or:

$$C = I \cdot dT/dE$$

Thus, for a fully-charged 100 Ah battery having an open circuit voltage of 12.68 volts and a completely discharged voltage of 11.89 volts (Table 1):

$$C = (5 \cdot 20 \cdot 3600)/(12.68 - 11.89) \text{ amp-sec per volt}$$

or:

$$C = 455{,}696 \text{ farads}$$

Since the effect of the parallel capacitor 12 is very small compared to the very large time constant (RC) of the storage battery (typically one hour), it will be ignored for the rest of this analysis.

A short computer program that models a storage battery, using the above values for C and R (including the variation of R), is readily developed employing the above equations. One presently preferred program, written in the BASIC programming language, is reproduced in FIG. 4.

The computer program listed in FIG. 4 solves the differential equations for the storage battery model using a numerical integration approach. The program assumes an invariant current over a time interval (dT) of two seconds. This short time interval does not introduce great error in the result due to the very large time constant of the battery system (RC>2000 seconds). Such a computer program can accurately model the performance of an actual storage battery.

Figure 5A:
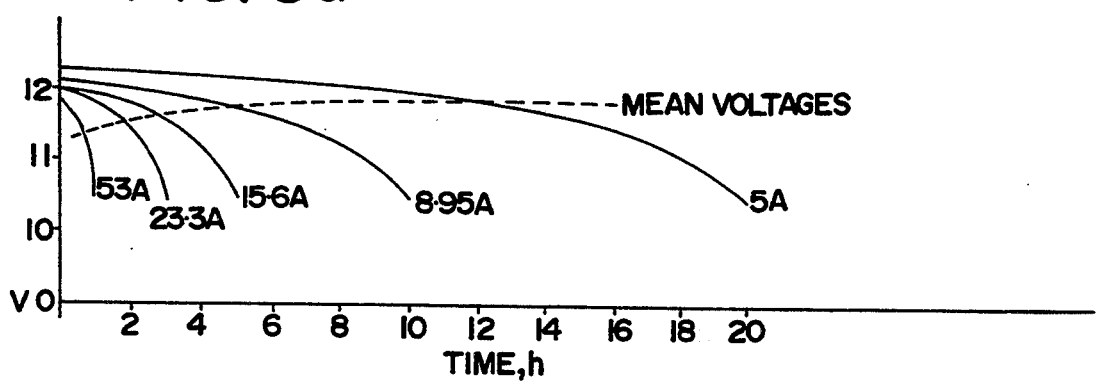
FIG. 5(a) shows measured low current discharge data.
Figure 5B:
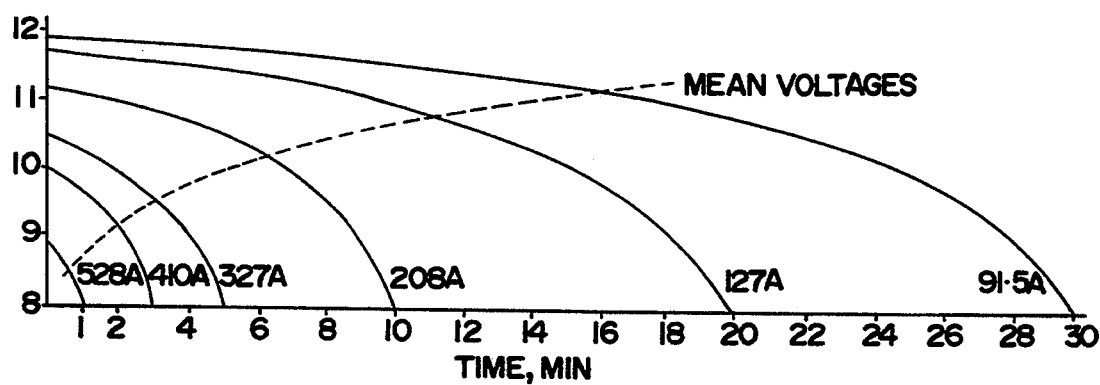
FIG. 5(b) shows measured high current discharge data.
Figure 6A:
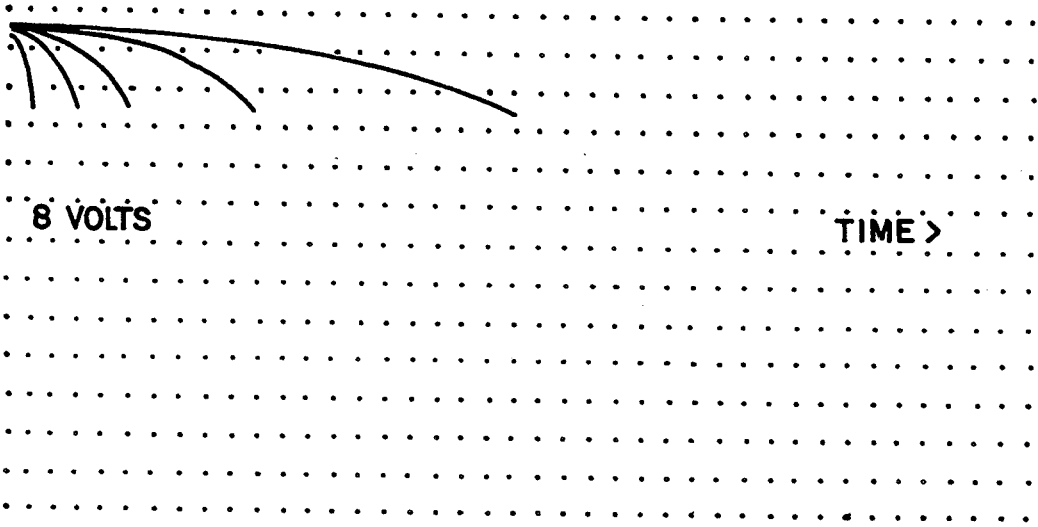
FIG. 6(a) shows simulated low current discharge data.
Figure 6B:
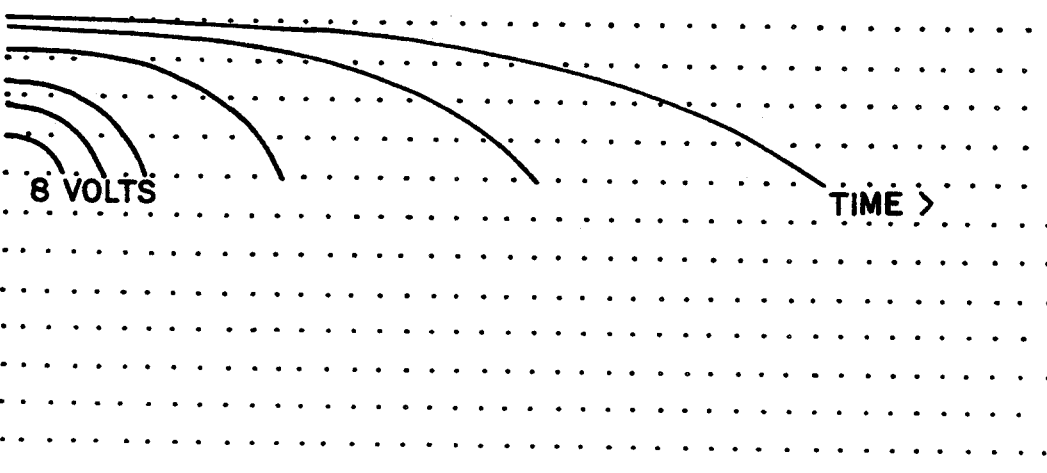
FIG. 6(b) shows simulated high current discharge data.

In FIG. 5, two plots of actual test data showing discharge voltage curves for a 12-volt, 100 Ah battery at room temperature are provided. The computer generated plots shown in FIGS. 6(a) and 6(b) were produced by the program set out in FIG. 4. These computer generated plots (FIGS. 6(a) and 6(b)) show remarkable agreement to the actual test data depicted in FIGS. 5(a) and 5(b), thus verifying the accuracy of the program to model a real computer storage battery. This coincidence of data confirms that it is possible to measure the state-of-charge of a battery by modeling the battery as an equivalent electrical circuit. From the above equations, therefore, a state-of-charge (SOC) system for a battery can be developed.

SOC System

A state-of-charge metering system made according to this invention employs forced or compelled agreement to solve for the internal parameters of a battery. The following assumptions have been made in order to develop the state-of-charge system.

First, it is assumed that a given electrical device has a continuous time domain transfer function such that passing an input (Ein(t)) through the transfer function f(t) yields all output (Eo(t)); or:

$$Ein(t) \to f(t) \to Eo(t)$$

Thus, if any two of these three functions (Ein(t), f(t), or Eo(t)) are known, the third can be uniquely determined.

Second, it is also assumed that if the function f(t) is in the form of a complex impedance (Z), then passing a current I(t) through a filter (Z) yields the output Eo(t), or:

$$I(t) \to Z \to Eo(t)$$

As a result, if the device concerned is a storage battery, then the internal parameters of the battery can be determined.

If a value for Z is defined, then either of the functions I(t) or Eo(t) can be obtained if the other is known. This solution can be accomplished analytically if the known signal is a time function such as an impulse, step, ramp, sine, or cosine function, in which case the solution is achieved through transform calculus. However, if the known function is a continuously varying function (such as real time operational variations), then the above method will not yield accurate results. For continuously varying functions, an alternate technique must be used.

Figure 7:
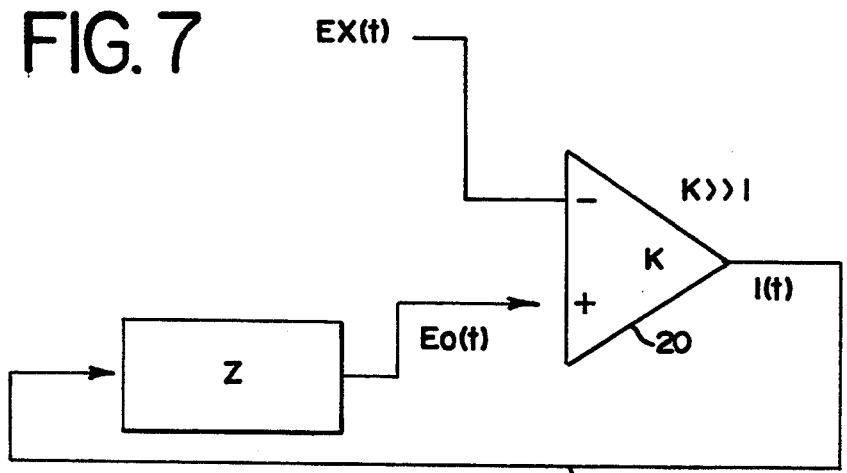
FIG. 7 is an analog circuit model of a compelled agreement system used to model the state-of-charge of a storage battery.

Referring to FIG. 7, what is shown is a simplified analog circuit used to model the state-of-charge of a battery. The analog model shown in FIG. 7 was developed from the above equations, and employs the compelled agreement technique mentioned above. In FIG. 7, an amplifier 20 is selected to have a very high gain ($K>>1$), such that when a feedback loop 22 is closed the equations for the system become:

$Ex(t)$ = known voltage as a function of time $Z$ = known system impedance

Thus, assuming that $Eo(t)$ equals $I(t)*Z$, the amplifier output (E) becomes:

$$E = K*Eo(t) - K*Ex(t)$$

where E is compelled to be equal to $I(t)$. ($I(t)$ is the output of the hi-gain amplifier 20.) Thus:

$$I(t) = K*Eo(t) - K*Ex(t)$$

However, if:

$$I(t) = K*I(t)*Z - K*Ex(t)$$

then:

$$I(t)*[1 - K*Z] - K*Ex(t)$$

Since the gain K was previously determined to be very large ($K>>1$) we can assume that $[1-K*Z] = -K*Z$, and therefore:

$$I(t) = -K*Ex(t)/-K*Z.$$

or:

$$I(t) = Ex(t)/Z$$

As a result, the output of the amplifier 20 is very nearly equal to the current, and $Eo(t)$ must equal $Ex(t)$.

Extending the above analysis to a battery model, a battery current can be computed without the use of any external coils or other sensors. In addition, the internal voltages of the battery can be computed without probes or other devices. Thus, a method for examining the detailed internal operation of a storage battery is obtained by developing an accurate model of the capacity and resistance of the battery, and then driving that model from a simple comparison circuit 24 as shown in FIG. 7. The model developed is the basis for the state-of-charge metering system of the invention, described more fully below.

Once a value for the state-of-charge is determined, it can be presented to an operator in terms of the total charge of the battery (i.e. full, half-full, empty, etc.). As those skilled in the art will appreciate, by virtue of having a running electronic history of the particular battery usage, it is possible to calculate the duration at which the battery could operate at current or projected demands. This latter measurement can be presented to the operator of an electric vehicle in terms of either time and/or miles remaining before recharging is required.

Digital Computer Model

Due to the presently advanced nature of computers, digital electronics and software techniques, a digital computer model of the SOC system is a viable solution. As those skilled in the art will appreciate, since digital devices do not suffer from the elements of drift and leakage, digital systems are inherently stable. Thus, a digital model presents a practicable solution to the state-of-charge metering required for EV's and other devices employing storage batteries.

An advantage to using a digital model also results from the extremely long time constants seen in a storage battery, which allow the use of inexpensive analog-to-digital (A/D) converters operating at relatively low sampling rates. Indeed, most of the battery data shown in FIGS. 6(a) and 6(b) that were used to develop the digital computer model were gathered using a 12-bit A/D converter operating at a sample rate of 15-Hertz. By employing relatively slow digital data conversion techniques, a very useful and accurate battery simulation is realized.

As already mentioned, the relatively simple BASIC program disclosed in FIG. 4 has been shown to accurately simulate and predict the performance of a 100 Ah, 12-volt battery. From the program shown in FIG. 4, a real-time digital computer model can be built to calculate the performance, and thus the state-of-charge, of a real battery.

Set forth in FIG. 8 is a more detailed presently preferred program, also written in the BASIC language. The program provided in FIG. 8 computes the charge or discharge current and state-of-charge for a real (as opposed to simulated) battery. The program of FIG. 8 employs a finite difference solution to more accurately interpret the electrical characteristics of the battery compared to the numerical integration approach shown in FIG. 4. The finite difference technique also includes a sample computation routine and uses compelled agreement as discussed above in connection with the analog circuit model of FIG. 7.

To simulate the variations that naturally take place in a battery, a series of step changes were included in the program set forth in FIG. 8. A forcing "gain" of 50, to simulate the hi-gain amplifier 20 of the analog model, also appears at steps 260 and 530 in the program. This gain will result in at most an error in agreement of 1 part in 50, which is tolerable for the storage battery systems targeted.

A finite impulse response (FIR) filter is also included at lines 540 and 630 of the program. The FIR filter appearing at line 540 approximates a Sin x/x spectral response; and the FIR filter included at line 630 generates the necessary $Z^{-1}$ intervals for the calculation. These techniques are employed to ensure system stability. Thus, as those skilled in the art will appreciate, the greater the number of points included in the FIR filter, the less noise will affect the accuracy of the state-of-charge metering system.

The program shown in FIG. 8 includes a five-point FIR filter for ease of implementation. However, a simple five-point FIR limits the magnitude of the forcing "gain" employed in the program. To increase accuracy, a higher gain, for example 2000, is preferred. Such a gain will, however, necessitate a larger filter.

It should be noted that the FIR filter shown in FIG. 8 was included due to the RS-232 communication interface, and associated program overhead, employed in one embodiment of the digital state-of-charge system. In the more preferred embodiment of the digital system employing a parallel data path between the CPU and the A/D converter discussed below, the simple five-point filter should be adequate to eliminate any undesirable noise in the battery signal.

As shown in FIG. 8, at step 100, the large capacitor is also initialized. A value for the terminal resistance of the battery is also included at step 110.

The program then falls through to the subroutine labelled "START." The START subroutine first determines the temperature at which the battery is operating at lines 180 to 220. At step 250, the terminal voltage of the monitored battery is determined employing the five-point FIR filter discussed above. After the terminal voltage is computed, the current is computed at step 260 using the compelled agreement function mentioned above. The variable "KF" represents the forcing gain included in the program. Subsequently, at step 270, the $Z^{-1}$ intervals for the FIR filter are determined.

The program then proceeds to the "BEGIN" subroutine. At step 540 in the BEGIN subroutine, the current for the battery is calculated using the FIR filter. At step 590, the charge on the large capacitor is calculated using an integration technique. Next, the battery resistance is calculated at step 600 and a value for the terminal voltage "E" is calculated at step 610. The $Z^{-1}$ intervals for the FIR filter for the current are determined at step 630 and then execution returns to the START routine.

Figure 9A:
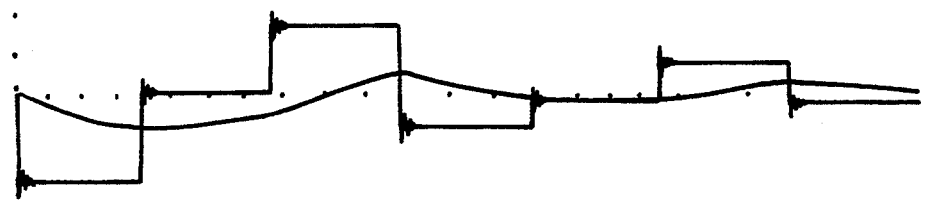
FIG. 9 is a graph of the output generated from the preferred computer program shown in FIG. 8.
Figure 9B:
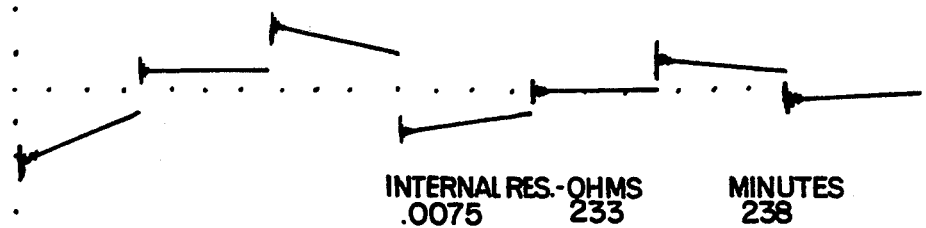

FIG. 9 shows a computer-generated plot of the results obtained from execution of the program shown in FIG. 8. The plot shown in FIG. 9(b) adequately demonstrates the ability of the program, and thus the digital model, to track changes in the battery terminal voltage. Due to the sampling time interval and the fact that the input voltage was comprised of step changes, however, there is a slight ringing of the output from the computer model. When compared to the plot of FIG. 9(a), which is the actual measured response of a storage battery, this slight ringing at the start of each step becomes inconsequential.

Figure 10:
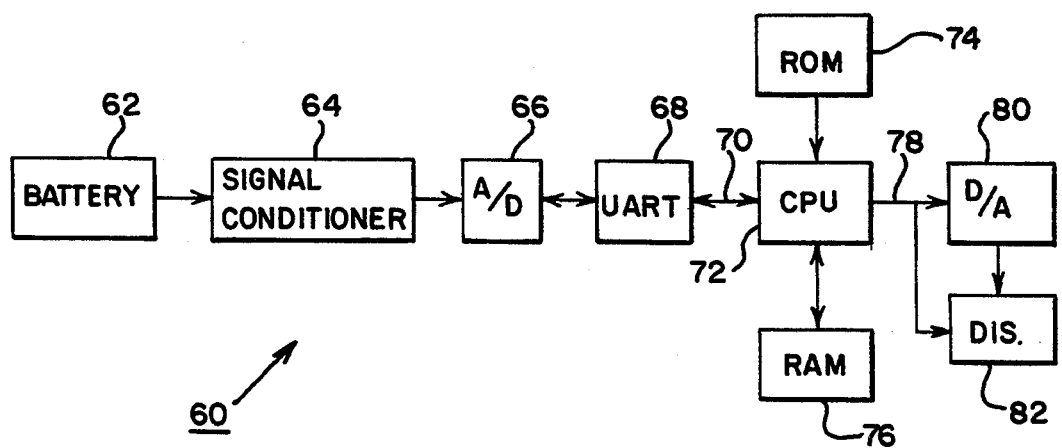
FIG. 10 is a block diagram of a presently preferred digital computer system of the state-of-charge metering system made according to the invention.

A block diagram of one presently preferred embodiment of the digital computer model made according to the invention appears in FIG. 10. As seen in FIG. 10, the digital computer model 60 preferably includes a battery 62, a signal conditioner circuit 64, A/D and digital-to-analog (D/A) converters 66, 80, a CPU 72 and a display system 82. (The CPU 72 may comprise a microprocessor (not shown) in the preferred embodiment.) In one presently preferred embodiment of the digital computer model 60, these elements are each provided on a single integrated circuit. In an alternate preferred embodiment of the digital computer model 60 (not shown), many, if not all of these elements may be included in a single custom application specific integrated circuit (ASIC).

As shown in FIG. 10, battery data obtained from the battery 62 is first processed by a signal conditioner circuit 64. The signal conditioner circuit 64 is employed to convert the 12-volt battery signal to the 5-volt TTL levels employed in the digital computer model 60. Once the battery voltage has been converted to TTL levels, the analog signal appearing at the output of the signal conditioner circuit 64 is converted to a digital signal by the A/D converter 66. With the signal from the battery in digital form, it can be communicated to the CPU 72 to develop a state-of-charge signal.

As mentioned above, an RS-232 communication channel 70 is employed in one embodiment to facilitate communication between the A/D converter 66 and the CPU 72. To convert the parallel data obtained from the A/D converter 66 to the serial data necessary for the RS-232 communication channel 70, a universal asynchronous receiver transmitter (UART) 68 is employed. In a more presently preferred embodiment, however, the communication channel 70 comprises a parallel data bus directly connecting the A/D converter 66 to the CPU 72. In this embodiment, of course, the UART 68 is not necessary.

In the presently preferred embodiments, the A/D converter 66 is a 12-bit converter, which operates at a low sampling rate. Due to the long time constant of the battery 62 employed with the digital computer model 60, a 12-bit A/D converter 66 is sufficient to ensure the desired accuracy. With a 12-bit A/D converter 66, a 16-bit (or greater) data path to the CPU 72 is preferred in order to reduce access time over the communication channel 70. However, as those skilled in the art will appreciate, an 8-bit data path can also be employed in the CPU 72, but will result in at least two transactions over the communication channel 70 to obtain a complete readout from a 12-bit A/D converter 66.

In the digital computer model 60 shown in FIG. 10, memory in the form of ROM 74 and RAM 76 is connected to the CPU 72. An executable form of the program similar to that shown in FIG. 8 resides in the ROM 74 for execution by the CPU 72. The RAM 76 is provided in order to store data used to calculate the state-of-charge of the battery 62. Due to the inherently small amount of program and data space required in the digital computer model 60, the size of the ROM 74 and RAM 76 can be small, thus reducing the overall expense of the system.

The state of charge program executing on the CPU 72 will produce a signal indicative of the state-of-charge of the battery 62. This signal can be communicated from an input/output port (not shown) in the CPU 72 over a signal line 78. If the state-of-charge signal communicated over the signal line 78 is to be presented in an analog form, a D/A converter 80 is necessary. Alternatively, if the state-of-charge signal is to be communicated to an operator through a digital display, such a D/A converter 80 is not required.

As shown in FIG. 10, a display 82 is provided for communication to an operator of a signal representative of the state-of-charge of the battery 62. In one preferred embodiment, the display 82 comprises a digital readout; and in an alternate embodiment, the display 82 can comprise a meter much like the current fuel gauges employed with internal combustion vehicles. As those skilled in the art will appreciate, in the embodiment employing a digital display 82, circuitry can also be employed to indicate to the operator the remaining miles and/or operating time before recharging of the battery 62 is required. Such techniques for presenting the remaining miles and/or time are well known in the art, and their discussion is not required herein. In one preferred embodiment of the digital display 82, the display can take the form of either a liquid crystal display or a luminescent display.

The state-of-charge metering system made according to the invention provides numerous advantages over the prior art systems for determining the remaining charge in a storage battery. The state-of-charge metering system of the invention provides an indication, in the form of a display or gauge, directly to the operator of the device employing a storage battery. The operator thus does not need to shut off the device and operate complicated instrumentation such as hydrometers and voltmeters to calculate by hand the state-of-charge of the battery. The digital system of the invention accurately and continuously calculates the state-of-charge of the battery to which it is connected and displays in real-time to the operator the remaining charge in the battery.

I claim:

1. A system coupled to a battery for measuring the state-of-charge of the battery while a device attached to said battery is operating, comprising:
   a battery;
   means for measuring the actual terminal voltage of the battery during operation of the device;
   means for simulating at least some of the internal electrical characteristics of the battery, said means for simulating including:
      circuit means for simulating the internal impedance of the battery with respect to time, said circuit means including capacitance means for simulating the internal capacitance of the battery; and
      means responsive to a function of the simulated internal impedance for simulating the terminal voltage of the battery;
   means for equating the simulated terminal voltage to said measured actual terminal voltage of the battery; and
   means for developing a signal representing the state-of-charge of the battery in response to the voltage across said simulated internal capacitance of the battery.

2. The system defined in claim 1, further comprising means responsive to said function of the voltage across said simulated internal capacitance of the battery for communicating the state-of-charge of the battery.

3. The system defined in claim 1, wherein the means for equating comprises an operational amplifier.

4. A system coupled to a battery for measuring the state-of-charge of the battery while a device attached to said battery is operating, comprising:
   a battery;
   means for measuring the actual terminal voltage of the battery during the operation of the device;
   means for modeling at least some of the internal electrical characteristics of the battery, said means for modeling including:
      first means for modeling the internal impedance of the battery with respect to time, and for modeling the internal capacitance characteristics of the battery; and
      second means responsive to the modeled internal impedance for modeling the terminal voltage of the battery;
   means for equating the modeled terminal voltage to said measured actual terminal voltage of the battery; and
   means for developing a signal representative the state-of-charge of the battery in response to the modeled internal capacitance characteristics of the battery.

5. The system defined in claim 4, further comprising means responsive to said function of the modeled internal capacitance characteristics of the battery for communicating the state-of-charge of the battery.

6. A system coupled to a battery for measuring the state-of-charge of the battery while a device attached to said battery is operating, comprising:
   a battery;
   a first circuit for measuring the actual terminal voltage of the battery during operation of the device;
   an electronic circuit for simulating at least some of the internal electrical characteristics of the battery, said electronic circuit including:
      a second circuit for simulating the internal impedance of the battery with respect to the time, said second circuit including a capacitor for simulating the internal capacitance of the battery; and
      a third circuit responsive to the simulated internal impedance for simulating the terminal voltage of the battery;
   an amplifier circuit, receiving as inputs the measured actual terminal voltage of the battery and the simulated terminal voltage of the battery, for equating the simulated terminal voltage to said measured actual terminal voltage of the battery; and
   means for generating a signal representing the state-of-charge of the battery responsive to the voltage across said simulated internal capacitance of the battery.

7. The system defined in claim 6, further comprising a display responsive to voltage across said simulated internal capacitance of the battery for communicating the state-of-charge of the battery.

8. The system defined in claim 6, wherein the amplifier circuit comprises an operational amplifier.

9. A method for measuring the state-of-charge of a battery attached to a device while said device is operating, comprising the steps of:
   providing a battery;
   measuring the actual terminal voltage of the battery during the operation of the device;
   modeling the internal impedance and capacitance characteristics of the battery with respect to time;
   modeling the terminal voltage of the battery responsive to the modeled internal impedance of the battery;
   receiving the measured actual terminal voltage of the battery and equaling the modeled terminal voltage to said measured actual terminal voltage of the battery; and
   communicating an output signal representing the state-of-charge of the battery as a function of the modeled internal capacitance characteristics of the battery.

10. The system defined in claim 1, wherein the means for simulating at least some of the internal electrical characteristics of the battery comprises a central processor unit.

11. The system defined in claim 6, wherein the electronic circuit comprises a central processor unit.

* * * * *

UNITED STATES PATENT AND TRADEMARK OFFICE
CERTIFICATE OF CORRECTION

PATENT NO. : 5,381,096
DATED : January 10, 1995
INVENTOR(S) : Edgar A. Hirzel

It is certified that error appears in the above-indentified patent and that said Letters Patent is hereby corrected as shown below:

Column 12,

In claim 7, line 2, after "to" insert --the--.
Column 12,
   In claim 9, line 13, delete "equaling" and substitute --equating--.

Signed and Sealed this

Twelfth Day of March, 1996

*Attest:*

BRUCE LEHMAN

*Attesting Officer*     *Commissioner of Patents and Trademarks*